United States Patent [19]

Inamori

[11] Patent Number: 5,767,741
[45] Date of Patent: Jun. 16, 1998

[54] SELF COMPENSATING DIFFERENTIAL CIRCUIT

[75] Inventor: Masanori Inamori, Tenri, Japan

[73] Assignee: Sharp Kabushiki Kaisha, Osaka, Japan

[21] Appl. No.: 662,138

[22] Filed: Jun. 12, 1996

[30] Foreign Application Priority Data

Jun. 12, 1995 [JP] Japan .................................. 7-144719

[51] Int. Cl.$^6$ ........................................................ H03F 3/45
[52] U.S. Cl. ................................................ 330/252; 330/260
[58] Field of Search ................................. 330/252, 260; 327/560, 561, 563

[56] References Cited

U.S. PATENT DOCUMENTS

| | | |
|---|---|---|
| 3,689,752 | 9/1972 | Gilbert . |
| 3,931,583 | 1/1976 | Gilbert . |
| 4,075,574 | 2/1978 | Gilbert . |
| 4,156,283 | 5/1979 | Gilbert . |
| 4,547,744 | 10/1985 | Kasperkovitz ............... 330/252 X |

FOREIGN PATENT DOCUMENTS 4820932  6/1973  Japan .

*Primary Examiner*—James B. Mullins

[57] ABSTRACT

The invention presents a differential circuit capable of compensating for an error in differential output caused by voltage drop due to the emitter series resistance of transistors without being affected by the values of differential input currents and the current ratio of the input currents. A differential circuit comprises NPN type first and second transistors QA, QB, first and second resistors RA, RB connected between the collectors of the first and second transistors and a DC source voltage, means for connecting the collector of the first transistor to the base of the second transistor, means for connecting the collector of the second transistor to the base of the first transistor, first and second differential current input terminals TA, TB connected to the emitters of the first and second transistors, NPN type third and fourth transistors having their bases connected to the emitters of the first and second transistors, and emitters commonly connected to a constant current source IO, and first and second output terminals T1, T2 connected respectively to the collectors of the third and fourth transistors.

6 Claims, 8 Drawing Sheets

SELF COMPENSATING DIFFERENTIAL CIRCUIT

BACKGROUND OF THE INVENTION

1. Field of the Invention

The present invention relates to a differential circuit using a logarithmic characteristic of a transistor.

2. Description of the Related Art

Such a differential circuit is used in various fields, and below is described as an example a logarithmic compression and differential expansion circuit which is used as an amplifying circuit preferably in a gain control circuit, multiplication circuit, etc.

FIG. 5 shows a circuit diagram of a differential circuit disclosed in a typical prior art of Japanese Examined Patent Publication JP-B2 48-20932. In the differential circuit shown in FIG. 5, input transistors QA, QB are diode-connected by applying a constant voltage V to their bases and collectors. The emitters of the input transistors QA, QB are connected to input terminals TA, TB, respectively. The emitters of transistors Q1, Q2 are mutually connected, and are also connected to a constant current source IO, their bases are connected to the input terminals TA, TB, and their collectors are connected to output terminals T1, T2, respectively.

The operation of the circuit is as follows. The transistors QA, QB, Q1, and Q2 are matched transistors. Supposing emitter currents of the transistors QA, QB, Q1, and Q2 to be IA, IB, I1, I2, and base-emitter voltages of the transistors QA, QB, Q1, Q2 to be VBEA, VBEB, VBE1, VBE2, then with respect to the input transistors QA, QB a relation of $$\Delta VBE = VBEB - VBEA = (kT/q) \cdot Ln(IB/IA) \qquad (1)$$

and with respect to the transistors Q1 and Q2 a relation of $$\Delta VBE = VBE1 - VBE2 = (kT/q) \cdot Ln(I1/I2) \qquad (2)$$

are established, wherein q is primary electric charge, k is Boltzmann's constant, and T is absolute temperature.

From the circuit construction, $$VBEB + VBE2 = VBEA + VBE1$$

$$\therefore VBEB - VBEA = VBE1 - VBE2$$

and therefore $\Delta VBE$ in equation (1) and $\Delta VBE$ in equation (2) are equal to each other, and from equations (1) and (2), $$IB/IA = I1/I2 \qquad (3)$$

It is hence known that the input current ratio of input currents IB, IA is equal to the output current ratio of output currents I1, I2.

From equation (3), $$IB/(IA+IB) = I1/(I1+I2)$$

$$\therefore I1 = X \cdot I_0 \qquad (4)$$

wherein X=IB/(IA+IB), IO=I1+I2. Herein, X is a modulation coefficient varying from 0 to 1. Similarly, I2=(1−X)·IO.

The relations between the output currents I1, I2 and the modulation coefficient X of the input currents IA, IB in FIG. 5 is expressed by solid lines in FIG. 7. In FIG. 7, the axis of abscissa shows values of the modulation coefficient X and the axis of ordinate shows current values of the output current I1, I2. That is, the output currents I1, I2 are multiplication outputs of the modulation coefficient X and the current IO. This circuit is applied in various fields, and as an example the construction of a multiplication circuit in which the above-mentioned relation of multiplication output is utilized is shown in FIG. 8.

In the multiplication circuit of FIG. 8, equation (3) is rewritten as follows.

$$(I1-\Delta i)/(I1+\Delta I) = (Ie-\Delta I)/(Ie+\Delta I)$$

It is further changed to $$\Delta I = (Ie/I1) \cdot \Delta i$$

Herein, since $$\Delta i = Vin/Ri, \quad Vout = 2 \cdot RL \cdot \Delta I$$

then $$Vout = 2 \cdot (RL/Ri) \cdot (Ie/I1) \cdot Vin$$

and hence the differential output voltage Vout is proportional to the product of Vin and Ie/I1.

Moreover, this circuit is a circuit such that the input current is compressed into a logarithm in the input transistors QA, QB to convert into a voltage, and then differentially expand in the transistors Q1 and Q2 to convert into a current. Since the input is handled in current, and a circuit of a wide dynamic range operating at a low voltage can be easily constructed by handling the input in current, and it is also widely used in the circuits of wide range input signals such as sensor amplifiers (for example, AF (auto focus) sensor and AE (auto exposure) sensor for cameras). To handle signals of a wide dynamic range, logarithmic compression processing is carried out. In the AF sensor, for example, signals of about several nA to 1 mA are handled.

As described above, when the range of inputted current is wide, or when it is required to increase the input bias current for high frequency operation, in such circuit as shown in FIG. 5 using the logarithmic compression and differential expansion circuit, if the input current is hundreds of μA, the voltage drop due to the emitter series resistance including the contact resistance of the input transistors QA, QB becomes very large, which may lead to a problem of deviation from the input currents I1, I2 shown by solid lines, shown by broken lines in FIG. 7.

A circuit expressing such emitter series resistance as an equivalent series resistance r is shown in FIG. 6.

Supposing the emitter series resistance of both input transistors QA, QB to be r, the input transistors QA, QB may be expressed in the relation of $$\Delta VBE = (VBEB + r \cdot IB) - (VBEA + r \cdot IA) = (kT/q) \cdot Ln(IB/IA) + r \cdot (IB-IA)(5)$$

As known by comparing with equation (1), the second term r(IB−IA) of equation (5) is a cause of error due to a emitter series resistance r. Hence, from equation (5) and equation (2)

$$(IB/IA) \times exp(r(IB-IA)q/kT) = I1/I2 \qquad (6)$$

and the current ratio of output currents I1, I2 is not the input current ratio of input currents IB, IA, but it is known that the output current ratio is deviated by the portion of exp(r(IB−IA)q/kT) times.

That is, there is no problem if the current level of the input current is such that the difference r(IB−IA) of voltage drop due to the emitter series resistance r of the input transistors QA and QB is $$r(IB-IA) \ll kT/q(=26mV(T=300\ K))$$

but otherwise, as indicated by broken lines in FIG. 7, the linearity of the output current value to the input current ratio may be deviated.

In the emitters of the transistors Q1, Q2, an emitter series resistance ra is also present, but since the bias current IO of the differential circuit formed by the transistors Q1, Q2 is generally set about 10 µA, the error voltage ra(I1-I2) due to the emitter series resistance generated in the voltage difference of VBE of the transistors Q1, Q2 is, supposing IO=I1+I2=10 µA, r: 5Ω, as follows:

$$ra(I1-I2) \leq 50\ \mu V \ll kT/q$$

and the deviation of the output current to the input current ratio due to the emitter series resistance ra of the transistors Q1, Q2 is by a factor of 10 to 100 smaller than the deviation of the output current to the input current ratio when the input current by the emitter series resistance r of the input transistors QA, QB is more than hundreds of µA, and it is negligible (the deviation is only about 0.16% at maximum).

An example is described. Supposing the emitter series resistance r to be 5Ω, the input current to be 200 µA, and the input current ratio to be IA:IB=1:9 (IA=20 µA, IB=180 µA), from equation (5)

$$\begin{aligned}\Delta VBE &= 26\ mV \cdot Ln(180\ \mu A/20\ \mu A) + 0.8\ mV \\ &= 57.2\ mV + 0.8\ mV \\ &= 58.0\ mV\end{aligned}$$

and this ΔVBE is inputted into the Q1, Q2 of the differential circuit.

From equation (6), the output current ratio, $$\begin{aligned}I1/I2 &= (180\ \mu A/20\ \mu A) \times exp(0.8\ mV/26\ mV) \\ &= (9/1) \times 1.03 \\ &= 9.27\end{aligned}$$

and therefore the output current ratio I1/I2 is largely deviated from the input current ratio IB/IA=9.00, and an error occurs in the output characteristic, for example, in the multiplication circuit in FIG. 8.

SUMMARY OF THE INVENTION

It is hence an object of the invention to provide a differential circuit capable of compensating for an error in differential output caused by voltage drop due to the emitter series resistance of transistors without being affected by the values of differential input current and their current ratio.

A circuit of the invention is constructed in such a manner that resistors with resistance values corresponding to emitter series resistances of the input transistors QA, QB are connected to collectors of the input transistors QA, QB, and a base of the input transistor QA is connected to a collector of the input transistor QB, and a base of the input transistor QB is connected to a collector of the input transistor QA.

Such circuit construction acts to always compensate for an error in differential output caused by voltage drop due to the emitter series resistances of the input transistors QA, QB, regardless of the input current value and input current ratio.

As mentioned above, the invention provides a differential circuit of a simple construction compensating always for an error in differential output caused by voltage drop due to the emitter series resistance, regardless of the current values of input currents and the current ratio of input currents.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
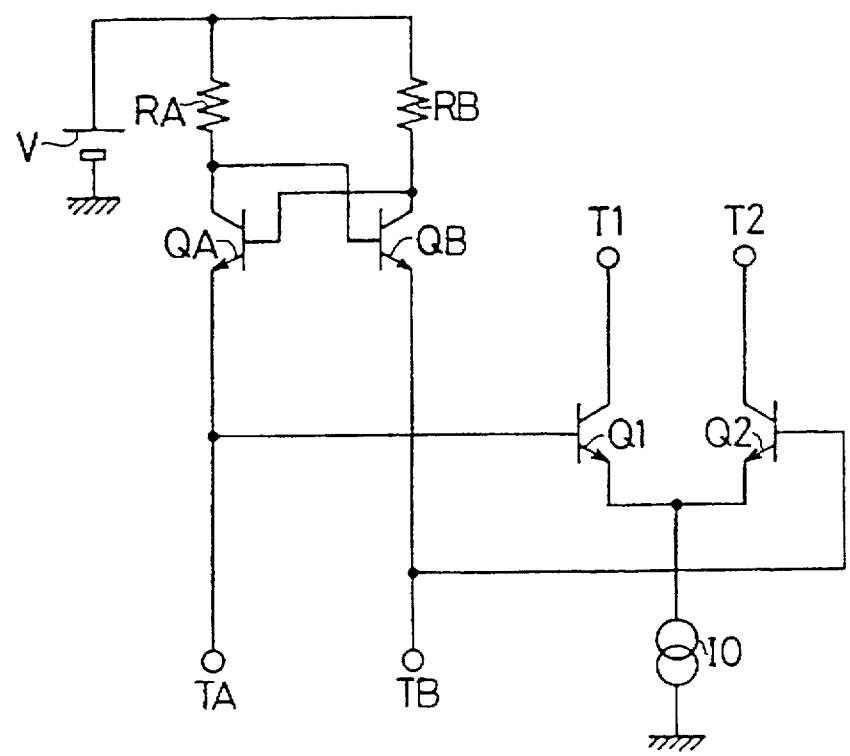
FIG. 1 is a circuit diagram showing a differential circuit of the invention.

Now referring to the drawings, preferred embodiments of the invention are described below.

FIG. 1 shows a first embodiment of the invention. To the collector of the input transistor QA, a resistor RA with a resistance value corresponding to the emitter series resistance r of the input transistor QA is connected, to the collector of the input transistor QB, a resistor RB with a resistance value corresponding to the emitter series resistance r of the input transistor QB is connected, other terminals of the resistors RA, RB are both connected to a DC source voltage V, and the emitters of the input transistors QA, QB are connected to the input terminals TA, TB via each emitter series resistance r. A differential input current is applied to the input terminals TA, TB.

Figure 2:
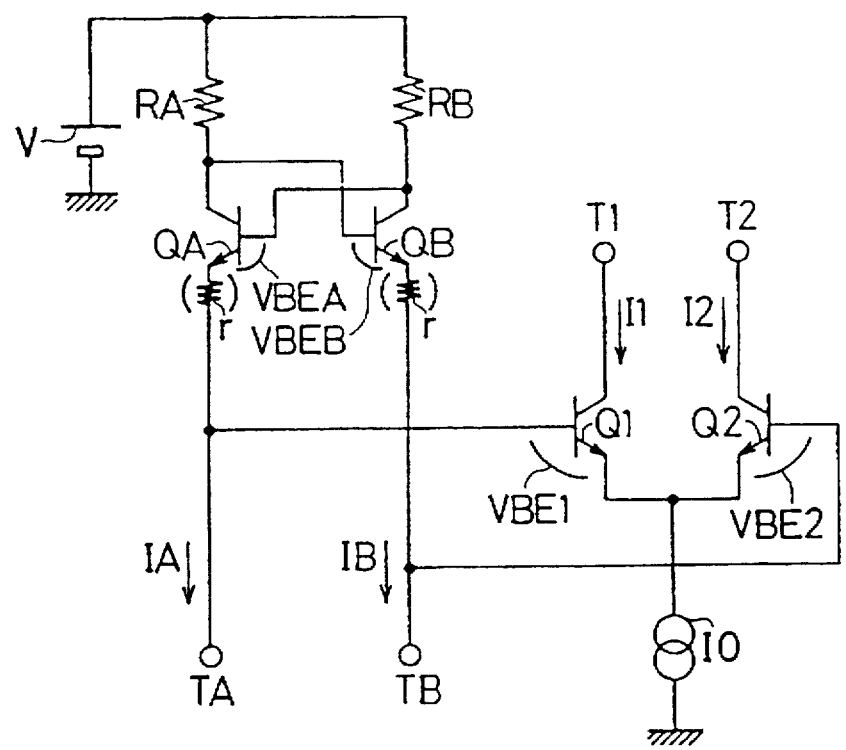
FIG. 2 is an equivalent circuit diagram in which the emitter series resistances of input transistors QA, QB in FIG. 1 are expressed as r.

The emitters of the transistors Q1, Q2, which are mutually connected, are connected to a constant current source IO, and their bases are connected to the input terminals TA, TB, respectively, and their collectors are connected to output terminal T1, T2. The operation in FIG. 1 is described while referring also to an equivalent circuit diagram in FIG. 2 in which the emitter series resistance is expressed as r.

Supposing the emitter currents of the input transistors QA, QB to be IA and IB, terminal voltages VTA, VTB of the input terminals TA, TB are expressed as follows.

$$VTA = V - (RB \cdot IB + VBEA + r \cdot IA)$$

$$VTB = V - (RA \cdot IA + VBEB + r \cdot IB)$$

Incidentally, VBEA and VBEB are ideal base-emitter voltages not including a voltage drop due to the emitter series resistance of the input transistors QA, QB. Since RA=RB=r, the differential voltage of VTA and VTB is $$VTA - VTB = (r \cdot IA + VBEB + r \cdot IB) - (r \cdot IB + VBEA + r \cdot IA) = VBEB - VBEA \qquad (7)$$

From the circuit construction, $$VTA - VBE1 = VTB - VBE2$$

and substituting equation (7) in this expression, $$VBEB-VBEA=VBE1-VBE2 \qquad (8)$$

Herein, the left side VBEB–VBEA is a differential voltage of an ideal base-emitter voltage not including a voltage drop portion due to the emitter series resistance of the input transistors QA, QB, and is the voltage expressed in equation (1). The right side VBE1–VBE2 is expressed in equation (2). Hence, from equations (1) and (2)

$$IB/IA=I1/I2.$$

According to the circuit construction of the invention, as described above, by eliminating the error caused by voltage drop due to the emitter series resistance noted in equation (6), the ideal characteristic equation (3) is expressed, so that the current ratio of output currents may be equal to the current ratio of input currents.

Figure 3:
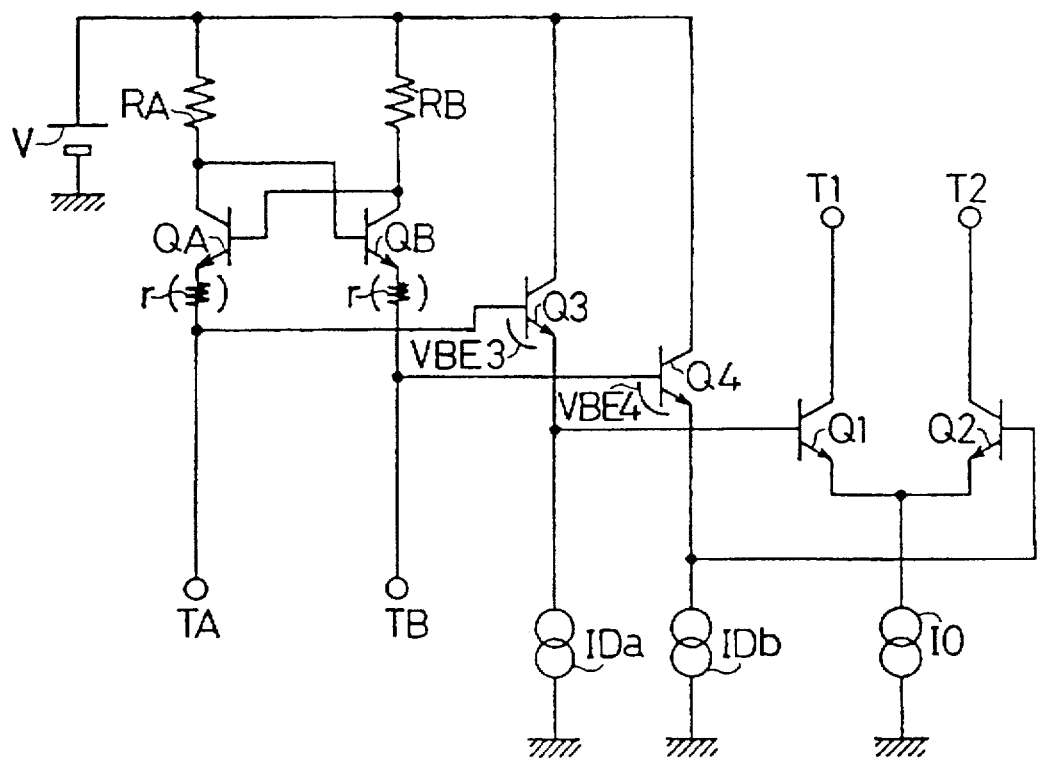
FIG. 3 is a circuit diagram of another embodiment of the invention.

FIG. 3 shows a circuit construction of a second embodiment in which an emitter follower circuit composed of transistors Q3, Q4 and constant current sources IDa, IDb connected to the emitters of the transistors Q3, Q4, respectively, is added. A reference character ID designates an electric current flowed from the constant current sources IDa, IDb. In such circuit construction in which the emitter follower circuit is added, too, by employing a circuit construction of the invention shown in FIG. 3 as the construction of a circuit in the periphery of the input transistors QA, QB, the differential voltage between the terminal voltages VTA, VTB of the input terminals TA, TB is, the same as in equation (7) shown in the first embodiment, as follows:

$$VTA-VTB=VBEB-VBEA \qquad (9)$$

On the other hand, from the circuit construction as shown in FIG. 3, $$VTA-VBE3-VBE1=VTB-VBE4-VBE2 \qquad (10)$$

Although VBE3, VBE4 are base-emitter voltages of the transistors Q3, Q4, the emitter currents of the transistors Q3, Q4 are all, ID, and hence $$VBE3=VBE4$$

and equation (10) is rewritten as $$VTA-VBE1=VTB-VBE2.$$

Substituting equation (9) in this equation, the same as equation (8), $$VBEB-VBEA=VBE1-VBE2 \qquad (11)$$

and hence, the same as in equation (8).

$$IB/IA=I1/I2.$$

As described above, the same effects of the invention can be also obtained in the circuit construction of the second embodiment shown in FIG. 3. This embodiment relates to a circuit composed of NPN transistors, and the same is achieved also in a circuit composed of PNP transistors of reverse polarity.

Figure 8:
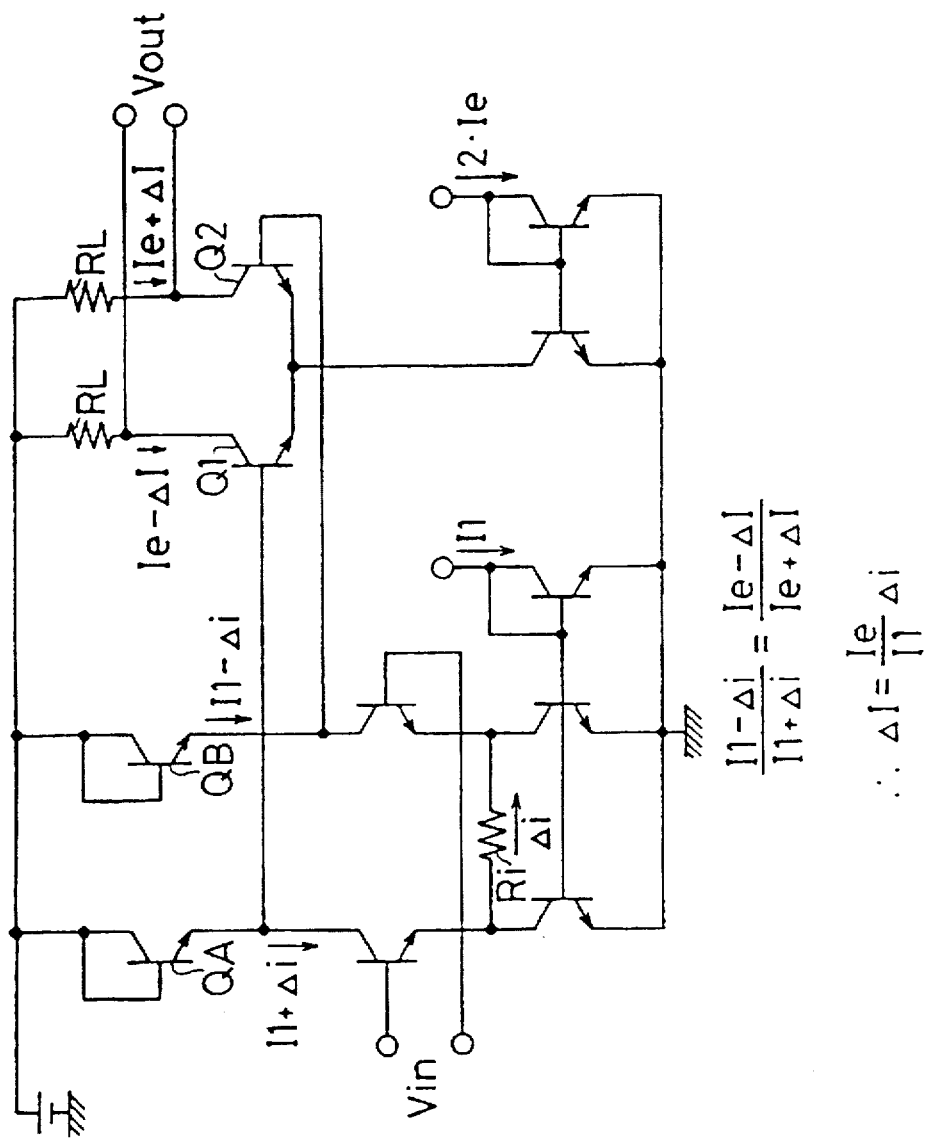
FIG. 8 is a circuit diagram showing a conventional multiplication circuit.

The embodiment is an example applied to a circuit serving the foundation of a logarithmic compression and differential expansion circuit, and it can be executed in all circuits using the logarithmic compression and differential expansion circuit. For example, an embodiment applied to the multiplication circuit in FIG. 8 is shown as a third embodiment in FIG. 4. In the diagram, the collectors of differential paired transistors Q11, Q12 are connected to the input terminals TA, TB.

Figure 4:
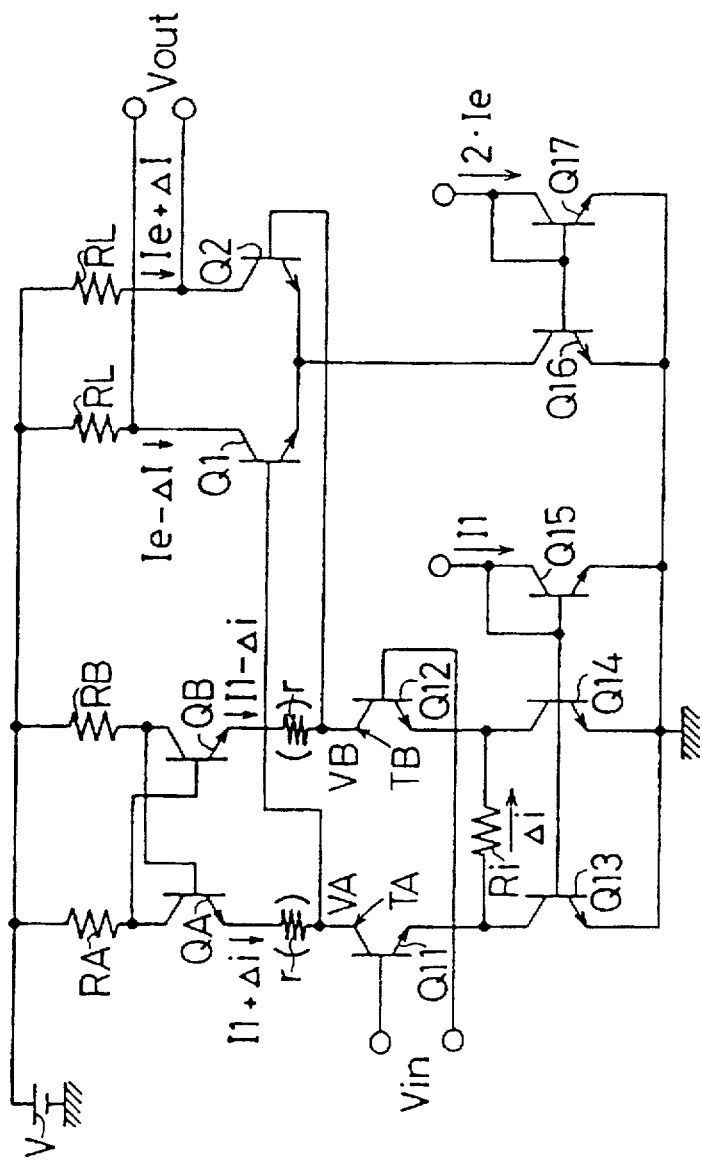
FIG. 4 is a circuit diagram of an embodiment of the invention applied in a multiplication circuit.
Figure 5:
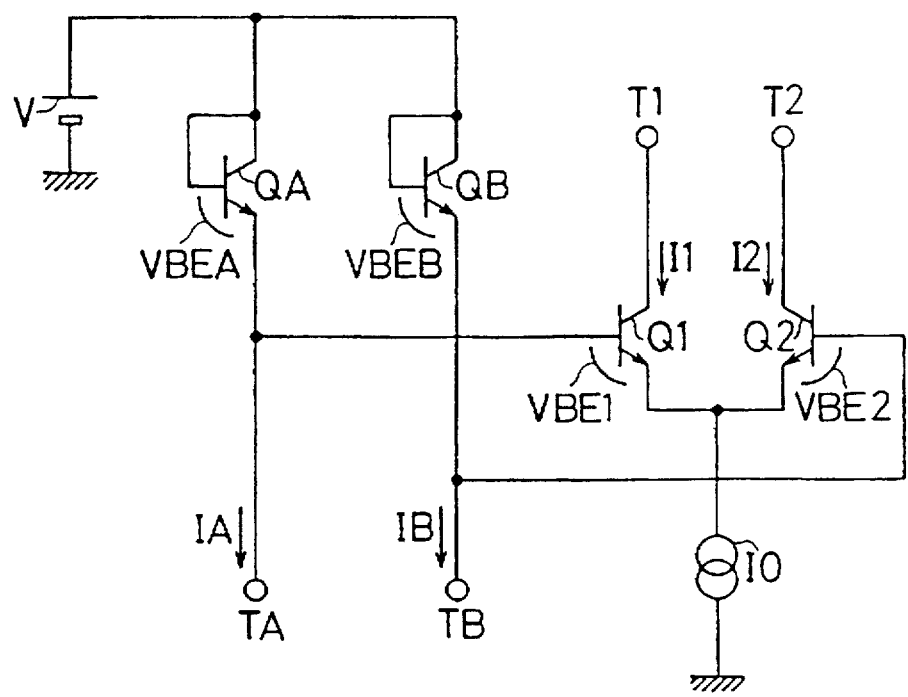
FIG. 5 is a circuit diagram of a conventional logarithmic compression and differential expansion circuit.
Figure 6:
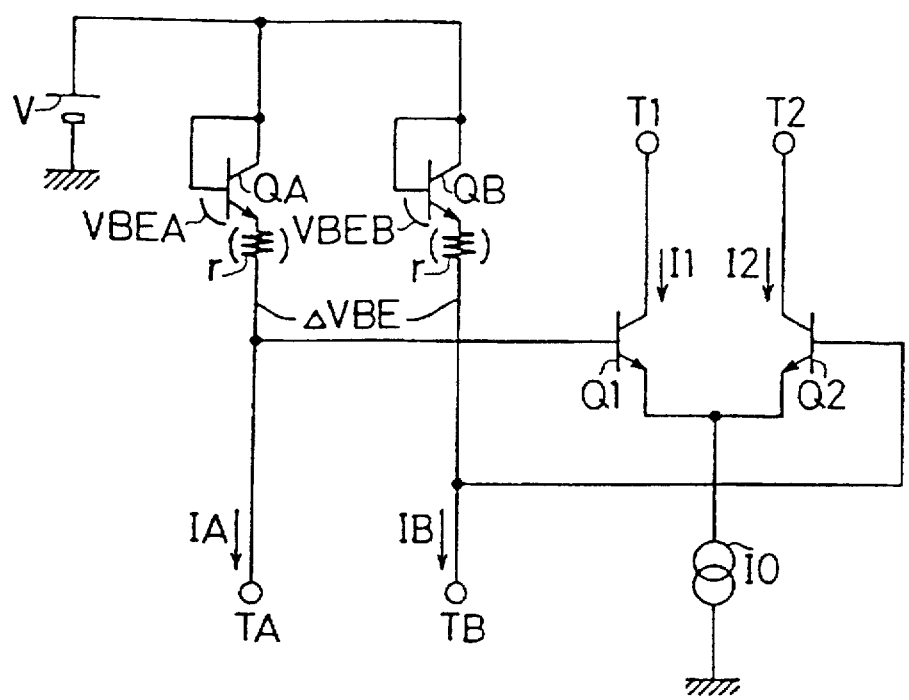
FIG. 6 is a circuit diagram of a conventional logarithmic compression and differential expansion circuit in which the emitter series resistances of input transistors QA, QB in FIG. 5 are expressed as r.
Figure 7:
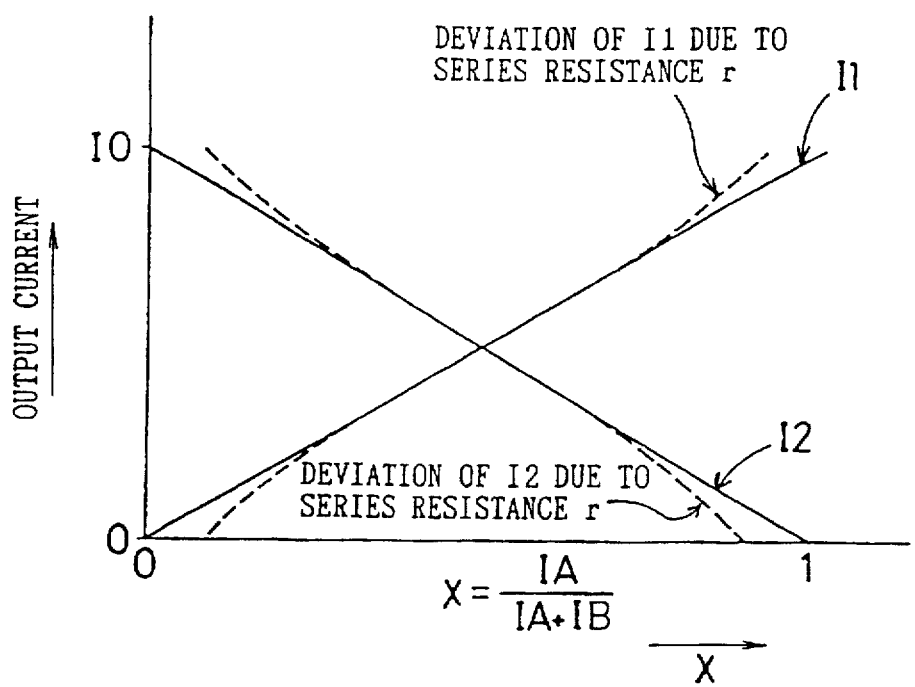
FIG. 7 is a relation diagram of the input current ratio and output currents in FIG. 5 and FIG. 6.

The emitters of the transistors Q11, Q12 are connected to a constant current circuit composed of a resistor Ri and transistors Q13, Q14, Q15. This constant current circuit forms a current mirror circuit. To the bases of the transistors Q11, Q12, an input voltage Vin is applied. On the other hand, a constant current source connected to the emitters of the transistors Q1, Q2 is composed of a current mirror circuit of transistors Q16, Q17. The other constitution in FIG. 4 is the same as in the circuit shown in FIG. 1 or FIG. 2.

Supposing the emitter series resistance of the input transistors QA, QB to be r, and resistors connected to the collectors of the input transistors QA, QB to be RA, RB, terminal voltages VA, VB of the input terminals TA, TB are respectively expressed as follows.

$$VA=V-\{RB \cdot (I1-\Delta i)+VBEA+r \cdot (I1+\Delta i)\}$$

$$VB=V-\{RA \cdot (I1+\Delta i)+VBEB+r \cdot (I1-\Delta i)\}$$

wherein VBEA, VBEB are ideal base-emitter voltages not containing a voltage drop portion due to the emitter series resistance of the input transistors QA, QB.

Moreover, since RA=RB=r, the differential voltage of VA and VB is $$\begin{aligned}VA-VB &= [V-\{r \cdot (I1-\Delta i)+VBEA+r \cdot (I1+\Delta i)\}] - \qquad (12) \\ &\quad [V-\{r \cdot (I1+\Delta i)+VBEB+r \cdot (I1-\Delta i)\}] \\ &= VBEA-VBEB\end{aligned}$$

From the circuit construction, $$VA+VBE1=VB+VBE2$$

and substituting equation (12) in this equation, $$VBEB-VBEA=VBE1-VBE2 \qquad (13)$$

Herein, the left side VBEB-VBEA is a differential voltage of an ideal base-emitter voltage not including the voltage drop portion due to the emitter series resistance of the input transistors QA, QB, that is, $$VBEB-VBEA=(kT/q) \cdot Ln((Ii-\Delta i)/(I1+\Delta i))$$

and the right side VBE1–VBE2 is $$VBE1-VBE2=(kT/q) \cdot Ln((Ie-\Delta I)/(Ie+\Delta I))$$

Substituting them in equation (13) then $$(I1-\Delta i)/(I1+\Delta i)=(Ie-\Delta I)/(Ie+\Delta I) \qquad (14)$$

From equation (14)

$$\Delta I=(Ie/I1) \cdot \Delta i$$

Herein, since $\Delta i=Vin/Ri$, $Vout=2 \cdot RL \cdot \Delta I$, $Vout=2 \cdot (RL/Ri) \cdot (Ie/I1) \cdot Vin$ and therefore the differential output voltage Vout is proportional to the product of Vin and Ie/I1, without being affected by the emitter series resistance of the input transistors QA, QB. So far is described an embodiment of the invention relating to logarithmic compression and differential expansion circuit, but not limited to this, it may be applied also to a general differential circuit as shown in FIG. 1.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A differential circuit comprising: a pair of transistors, each having an emitter, base and collector, a pair of input terminals respectively connected to the emitters, a resistor having a resistance equal to a series resistance including a contact resistance of the respective emitter connected between the collectors of the pairs of transistors and a source of direct current voltage, and wherein the bases of the transistors are cross-coupled to the collectors, whereby a differential signal devoid of an output error caused by a voltage drop due to the series resistance of the emitter including the contact resistance of the input transistors is generated.

2. A differential circuit comprising:

first and second transistors;

first and second resistors having a predetermined resistance, respectively connected between collectors of the first and second transistors and a direct current source voltage;

connecting means for connecting a collector of the first transistor to a base of the second transistor;

connecting means for connecting a collector of the second transistor to a base of the first transistor;

first and second differential current input terminals connected to emitters of the first and second transistors, respectively;

third and fourth transistors the bases of which are connected to the emitters of the first and second transistors respectively, the emitters being connected to a constant current source; and first and second output terminals connected to collectors of the third and fourth transistors respectively, wherein the resistance value of the first and second resistors is equal to the emitter series resistance including the contact resistance of the first and second transistors.

3. The differential circuit of claim 2, wherein the emitters of the first and second transistors are connected to bases of the third and fourth transistors respectively via emitter followers.

4. The differential circuit of claim 3, wherein the emitter followers comprise fifth and sixth transistors having respective bases which are connected to the first and second input terminals and respective emitters of the first and second transistors, collectors which are connected to a direct current source voltage, and respective emitters which are commonly connected to a constant current source and the respective bases of the third and fourth transistors.

5. The differential circuit of claim 2 and additionally including fifth and sixth transistors, each having an emitter, base and collector, located between the first and second transistors and the third and fourth transistors, and wherein the bases of the fifth and sixth transistors are respectively commonly connected to the first and second input terminals and the emitters of the first and second transistors, wherein respective constant current sources are connected to emitters of the fifth and sixth transistors, and wherein the respective emitters of the fifth and sixth transistors are connected to bases of said third and fourth transistors whereby a differential input signal is fed thereto.

6. A differential circuit for compensating for an error in an output signal caused by a voltage drop due to the emitter series resistance including contact resistance in a pair of input transistors irrespective of the values of a differential input current and a current ratio thereof, comprising:

a pair of input transistors, each including a base, emitter and collector, wherein the collectors are cross coupled and a pair of differential inputs are respectively coupled to the emitters of the input transistors;

a pair of resistors each having a resistance which is equal to a series resistance including a contact resistance of the emitters of the input transistors respectively connected between a DC voltage source and the collectors of the pair of input transistors; and a pair of output transistors also each including a base, emitter and collector, wherein the emitters of the pair of output transistors are commonly connected to a constant current source, and wherein the bases of the output transistors are respectively connected to the emitters of the pair of input transistors.

* * * * *